US011977326B2

(12) United States Patent
De Graaf et al.

(10) Patent No.: US 11,977,326 B2
(45) Date of Patent: May 7, 2024

(54) PELLICLE FOR EUV LITHOGRAPHY

(71) Applicant: ASML NETHERLANDS B.V., Veldhoven (NL)

(72) Inventors: Dennis De Graaf, Waalre (NL); Richard Beaudry, Shefford (CA); Maxime Biron, Bromont (CA); Paul Janssen, Eindhoven (NL); Thijs Kater, Eindhoven (NL); Kevin Kornelsen, Bromont (CA); Michael Alfred Josephus Kuijken, Son en Breugel (NL); Jan Hendrik Willem Kuntzel, Eindhoven (NL); Stephane Martel, Bromont (CA); Maxim Aleksandrovich Nasalevich, Eindhoven (NL); Guido Salmaso, Eindhoven (NL); Pieter-Jan Van Zwol, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 815 days.

(21) Appl. No.: 17/048,875

(22) PCT Filed: Apr. 12, 2019

(86) PCT No.: PCT/EP2019/059477
§ 371 (c)(1),
(2) Date: Oct. 19, 2020

(87) PCT Pub. No.: WO2019/211083
PCT Pub. Date: Nov. 7, 2019

(65) Prior Publication Data
US 2021/0240070 A1    Aug. 5, 2021

(30) Foreign Application Priority Data

May 4, 2018 (EP) .................................... 18170855

(51) Int. Cl.
G03F 1/64         (2012.01)
G03F 1/62         (2012.01)
G03F 7/00         (2006.01)

(52) U.S. Cl.
CPC .................. *G03F 1/64* (2013.01); *G03F 1/62* (2013.01); *G03F 7/70983* (2013.01)

(58) Field of Classification Search
CPC ............................... G03F 1/62; G03F 7/70983
USPC ............................................................ 430/5
See application file for complete search history.

(56) References Cited

U.S. PATENT DOCUMENTS

| 9,245,814 | B2 | 1/2016  | Fushie et al.    |
| 2008/0085599 | A1 | 4/2008  | Van Haren et al. |
| 2016/0195804 | A1 | 7/2016  | Kim et al.       |
| 2017/0097575 | A1 | 4/2017  | Pandey et al.    |
| 2017/0285461 | A1 | 10/2017 | Okubo et al.     |
| 2018/0045657 | A1 | 2/2018  | Smirnov et al.   |
| 2018/0046075 | A1 | 2/2018  | Han et al.       |
| 2018/0335705 | A1 | 11/2018 | Butler et al.    |

FOREIGN PATENT DOCUMENTS

| CN | 101162368   | 4/2008  |
| CN | 106206262   | 12/2016 |
| EP | 3151064     | 4/2017  |
| JP | 2012-031018 | 2/2012  |
| JP | 2014-069995 | 4/2014  |
| JP | 2017-031028 | 2/2017  |
| TW | 201721093   | 6/2017  |
| TW | 201730686   | 9/2017  |
| TW | 201809632   | 3/2018  |
| WO | 2017012846  | 1/2017  |
| WO | 2017036944  | 3/2017  |
| WO | 2017102383  | 6/2017  |
| WO | 2017186486  | 11/2017 |
| WO | 2018003603  | 1/2018  |
| WO | 2018008594  | 1/2018  |

OTHER PUBLICATIONS

Office Action dated Oct. 3, 2022, issued in corresponding Taiwan Patent Application No. 108115193, pp. 1-13.
International Search Report and Written Opinion issued in corresponding PCT Patent Application No. PCT/EP2019/059477, dated Jul. 30, 2019.
Office Action issued in corresponding Japanese Patent Application No. 2020-557937, dated Apr. 4, 2023.
Office Action issued in corresponding Chinese Patent Application No. 201980029381.7, dated Dec. 19, 2023.

*Primary Examiner* — Christopher G Young
(74) *Attorney, Agent, or Firm* — Pillsbury Winthrop Shaw Pittman, LLP

(57) ABSTRACT

A wafer including a mask on one face and at least one layer on an opposite face, wherein the mask has at least one scribeline which overlies at least a portion of the opposite face which is substantially free of the at least one layer is described. Also described is a method of preparing a pellicle, the method including: providing a wafer having a mask on one face and at least one layer on an opposite face, defining a scribeline in the mask, and selectively removing a portion of the at least one layer which at least partially overlies the scribeline as well as a method of preparing a pellicle, the method including: providing a pellicle core, and removing at least some material from at least one face of the pellicle core in a non-oxidising environment. In any aspect, the pellicle may include a metal nitride layer.

20 Claims, 3 Drawing Sheets

PELLICLE FOR EUV LITHOGRAPHY

CROSS-REFERENCE TO RELATED APPLICATIONS

This application is the U.S. national phase entry of PCT patent application no. PCT/EP2019/059477, which was filed on Apr. 12, 2019, which claims the benefit of priority of European patent application no. 18170855.3, which was filed on May 4, 2018 and which is incorporated herein in its entirety by reference.

FIELD

The present invention relates to a wafer, a method of preparing a wafer, a pellicle for a lithographic apparatus comprising said wafer, a method of preparing a pellicle, and a lithographic apparatus comprising a pellicle.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic apparatus includes a patterning device (e.g. a mask or reticle). Radiation is provided through or reflected off the patterning device to form an image on a substrate. A pellicle may be provided to protect the patterning device from airborne particles and other forms of contamination. Contamination on the surface of the patterning device can cause manufacturing defects on the substrate.

Pellicles may also be provided for protecting optical components other than patterning devices. Pellicles may also be used to provide a passage for lithographic radiation between regions of the lithography apparatus which are sealed from one another. Pellicles may also be used as filters, such as spectral purity filters.

Known pellicles may comprise, for example, a freestanding membrane such as a silicon membrane, silicon nitride, graphene or graphene derivatives, carbon nanotubes, or other membrane materials. A mask assembly may include the pellicle which protects a patterning device (e.g. a mask) from particle contamination. The pellicle may be supported by a pellicle frame, forming a pellicle assembly. The pellicle may be attached to the frame, for example, by gluing a pellicle border region to the frame. The frame may be permanently or releasably attached to a patterning device.

During use, the temperature of a pellicle in a lithographic apparatus increases to anywhere from around 500 up to 1000° C. or higher. These high temperatures can damage the pellicle and it is therefore desirable to improve ways by which to dissipate the heat in order to lower the operating temperature of the pellicle and improve pellicle lifespan.

One way in which this has been attempted is by applying a thin metallic film (a coating layer) on the pellicle, for example a ruthenium film. The metallic film increases the emissivity of the pellicle and thereby raises the rate at which heat is emitted from the pellicle, thereby causing the equilibrium temperature at which the pellicle emits heat at the same rate as it absorbs heat to be decreased. The metallic layer is provided on a face of the core of the pellicle, which may be, for example, a silicon wafer.

Due to the presence of the pellicle in the optical path of the EUV radiation beam, it is necessary for the pellicle to be as free of particles as possible. This is because the presence of particles can lead to imaging defects on the wafer and may also lead to hot spots on the pellicle, which could ultimately cause premature failure of the pellicle. With existing methods of preparing a pellicle comprising a core and a coating layer, a relatively large number of particles is generated which can contaminate the surface of the pellicle.

It is therefore desirable to provide a method for producing a pellicle which results in a pellicle having less particulate contamination than pellicles produced using existing techniques, as well as a pellicle produced according to such a method.

In addition, although a pellicle must be resilient enough to withstand the harsh environment inside a lithography apparatus, since it is in the optical path of the EUV radiation, it is desirable to reduce the amount of EUV radiation absorbed by the pellicle as this affects the number of wafers which can be imaged in a given time period.

It is therefore desirable to provide a pellicle having improved EUV transmissivity, but which also demonstrates good performance and which can be manufactured reliably.

Whilst the present application generally refers to pellicles in the context of lithography apparatus, in particular EUV lithography apparatus, the invention is not limited to only pellicles and lithography apparatus and it is appreciated that the subject matter of the present invention may be used in any other suitable apparatus or circumstances.

For example, the methods of the present invention may equally be applied to spectral purity filters. Practical EUV sources, such as those which generate EUV radiation using a plasma, do not only emit desired 'in-band' EUV radiation, but also undesirable (out-of-band) radiation. This out-of-band radiation is most notably in the deep UV (DUV) radiation range (100 to 400 nm). Moreover, in the case of some EUV sources, for example laser produced plasma EUV sources, the radiation from the laser, usually at 10.6 microns, presents a significant out-of-band radiation.

In a lithographic apparatus, spectral purity is desired for several reasons. One reason is that the resist is sensitive to out of-band wavelengths of radiation, and thus the image quality of patterns applied to the resist may be deteriorated if the resist is exposed to such out-of-band radiation. Furthermore, out-of-band radiation infrared radiation, for example the 10.6 micron radiation in some laser produced plasma sources, leads to unwanted and unnecessary heating of the patterning device, substrate, and optics within the lithographic apparatus. Such heating may lead to damage of these elements, degradation in their lifetime, and/or defects or distortions in patterns projected onto and applied to a resist-coated substrate.

A typical spectral purity filter may be formed, for example, from a silicon foundation structure (e.g. a silicon grid, or other member, provided with apertures) that is coated with a reflective metal, such as molybdenum. In use, a typical spectral purity filter might be subjected to a high heat load from, for example, incident infrared and EUV radiation. The heat load might result in the temperature of the spectral purity filter being above 800° C. Under the high head load, the coating can delaminate due to a difference in the coefficients of linear expansion between the reflective molybdenum coating and the underlying silicon support structure. Delamination and degradation of the silicon foundation structure is accelerated by the presence of hydrogen, which is often used as a gas in the environment in which the spectral purity filter is used in order to suppress debris (e.g. debris, such as particles or the like), from entering or leaving certain parts of the lithographic apparatus. Thus, the spectral purity filter may be used as a pellicle, and vice versa. Therefore, reference in the present application to a 'pellicle' is also reference to a 'spectral purity filter'. Although reference is primarily made to pellicles in the present application, all of the features could equally be applied to spectral purity filters.

In a lithographic apparatus (and/or method) it is desirable to minimise the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimise the amount of undesirable radiation (e.g. out-of-band) radiation that is passing through the lithographic apparatus and which is incident upon the substrate. Furthermore, it is desirable to ensure that a spectral purity filter used in a lithographic method or apparatus has an adequate lifetime, and does not degrade rapidly over time as a consequence of the high heat load to which the spectral purity filter may be exposed, and/or the hydrogen (or the like, such as free radical species including H* and HO*) to which the spectral purity filter may be exposed. It is therefore desirable to provide an improved (or alternative) spectral purity filter, and for example a spectral purity filter suitable for use in a lithographic apparatus and/or method.

Furthermore, whilst the present application generally refers to silicon pellicles, it will be appreciated that any suitable pellicle material may be used. For example, the pellicle may comprise any suitable carbon-based material, including, for example, graphene.

SUMMARY

The present invention has been made in consideration of the aforementioned problems with known methods of manufacturing pellicles and pellicles manufactured according to known techniques.

According to a first aspect of the present invention, there is provided a wafer comprising a mask on one face and at least one layer on the opposite face, wherein the mask comprises at least one scribeline which overlies at least a portion of the opposite face which is substantially free of the at least one layer.

Some pellicles are manufactured by depositing layers of material(s) onto a face of a silicon wafer. Parts of the wafer are subsequently selectively removed to yield the final pellicle. The silicon wafers used are circular as this is the common shape for silicon wafers to be due to the way in which they are produced. Due to restrictions of wafer processing equipment, it is desirable to maintain the circular shape for as long as possible in order to ease manipulation of the wafer. However, pellicles are generally not circular and therefore need to be shaped to remove excess material. This is conventionally done by etching a groove, also referred to as a scribeline, in the silicon wafer. The scribeline defines the edge or perimeter of the pellicle and acts as a weak point along which the pellicle can be removed from the remainder of the wafer. For practical reasons, the scribeline is formed in the same step in which the silicon wafer is etched from underneath the material on the surface of the wafer in order to form the 'window' through which the EUV radiation passes when the pellicle is in use in a lithography apparatus. The scribeline may be formed in the mask and/or the wafer.

Using current techniques, as the etching process does not etch through the material deposited on the surface of the wafer, it is inevitable that the material deposited on the surface of the wafer will bridge the scribeline. This bridging material is cut in a process known as 'dicing'. When the excess material is removed from the material which will ultimately form the pellicle, the bridging material is broken and particulate contaminants are created. These particles may settle on the surface of the pellicle and reduce the performance of the pellicle. It has been attempted to overcome this problem by breaking the bridging material in the presence of a vacuum in order to suck any particles produced away. It has also been attempted to overcome this problem by protecting the film on the surface of the wafer with a cap. However, both of these other attempts have proven unsuccessful.

It will be appreciated that the term 'overlies' considers the wafer to be in a generally horizontal configuration with the mask on the lowermost face and the at least one layer on the upper face of the wafer. The key feature is that the scribeline and the portion of the opposite face which is substantially free from the at least one layer overlie one another such that a line substantially parallel to the surface of the wafer would pass through both the scribeline and the portion substantially free from the at least one layer. As such, the at least one layer preferably does not extend across the entirety of the face of the wafer. It will also be appreciated that the scribeline may be angled relative to the surface of the wafer, namely the scribeline may not be perpendicular to the surface of the wafer. In this case, overlie is understood to mean that the portions of the mask and the at least one layer which have been removed or are otherwise not present are positioned such that the scribeline connects these portions. As such, when the scribeline is etched through the wafer, it connects the two portions which are substantially free from the mask and the at least one layer.

The wafer preferably comprises silicon.

Silicon is preferably used as it is a well-characterized and well-defined material in the field of lithography. Silicon also demonstrates good EUV transmissivity and is able to withstand the conditions within a lithographic apparatus. However, it will be appreciated that other suitable materials may be used and the invention according to the first aspect of the present invention is not limited to only silicon. Other suitable materials are ones which are known to be used in pellicles.

The mask may comprise a positive or a negative resist. Positive and negative resists are well known terms in the field of lithography and any appropriate resist may be used.

Where the mask comprises a negative resist, the resist is exposed to radiation which causes it to become less soluble in a developer solution. As such, the pattern of the resist corresponds to the material which will not be removed from the wafer to form the pellicle. As such, in the present invention the mask preferably comprises a negative resist.

The mask serves to define which portions of the wafer will be retained and which portions will be removed in subsequent processing steps. The mask comprises at least one scribeline which outlines the perimeter of the pellicle which may be ultimately produced from the wafer. As such, when using a negative resist, the scribeline will be substantially free from the resist in order to allow the underlying material to be etched away. In an embodiment, the mask protects a frame of wafer material which supports the material forming the pellicle itself, that is the layer of material which was originally deposited on one face of the wafer.

The at least one layer may comprise one or more of a membrane, a sacrificial layer, and a pellicle layer.

Although some pellicles are simple silicon pellicles, it has been found that the performance of the pellicle can be improved by providing one or more materials on the surface of the silicon or even depositing the materials onto the silicon and then subsequently removing the underlying silicon to leave just the materials which were deposited on the surface of the silicon wafer to form the portion of the pellicle through which the EUV radiation passes.

The pellicle layer may comprise at least one of a metallic layer, an oxide layer, a nitride layer, a silicide layer, a semi-metallic layer, and a non-metallic layer. The pellicle layer may comprise any suitable material which is chemically and/or thermally stable at the operating conditions in a lithographic apparatus and which allows EUV transmission.

Suitable metallic layers may comprise molybdenum, zirconium, and/or ruthenium. Oxide layers may comprise silicon dioxide or metal oxides. Nitride layers may comprise silicon nitride, silicon oxynitride, carbon nitride, boron nitride or similar. A silicide layer may comprise metal silicide, such as molybdenum, ruthenium, or zirconium silicide. A non-metallic layer may comprise carbon in any suitable form, preferably graphene.

It has been surprisingly found that a metal nitride layer may provide certain advantages for the ultimate pellicle. The metal nitride layer may comprise titanium nitride and/or tantalum nitride. The metal nitride layer may be of any suitable thickness. It is desirable to maximize the transmissivity of the pellicle to radiation used in lithography, for example EUV radiation, whilst still having the pellicle meet the other physical requirements to be suitable for use in a lithography machine, preferably an EUV lithography machine. As such, it is preferable for the pellicle to be as this as possible whilst also retaining the necessary physical characteristics required of a pellicle. The metal nitride layer may be between about 0.1 nm to about 6 nm in thickness. Preferably, the metal nitride layer is less than about 1 nm in thickness. The metal nitride may serve as a seeding layer. As such, the metal nitride may serve as a layer onto which another layer, which may be referred to as a capping layer, is provided. The capping layer may comprise any suitable material, including ruthenium, molybdenum, boron, zirconium, and combinations thereof. The capping layer may preferably comprise ruthenium. It has been surprisingly found that a metal nitride layer results in increased emissivity of the pellicle, so it is possible to have the same or better emissivity at the same metallic layer thickness or even at a reduced metallic layer thickness relative to previous pellicles. The metal nitride layer has also been surprisingly found to reduce or prevent dewetting of an overlying metallic layer, such as ruthenium. This allows the pellicle to be subject to higher powers than previously whilst still maintaining its integrity. There is also increased thermal stability, which also provides for an increased power capability for the pellicle. A further advantage is that the amount of pinholes in the pellicle layers is decreased and there is an increase in the proportion of the surface of the pellicle which is covered by the metallic layer. This prevents oxidation of underlying material and thereby reduces drift in the transmissivity of the pellicle over time with use. It is desirable to avoid changes in the transmissivity of a pellicle with use to allow for more consistent imaging of wafers. In addition, the metal nitride layer may act as a barrier to slow or prevent formation of metal silicides due to the reaction of the silicon and the metallic layer. The metal nitride may increase the temperature at which silicon and metal in the metallic layer react to form metal silicide, and thereby allow the pellicle to operate at higher power and/or temperature reliably. The metal nitride layer may be provided by any suitable method known in the art. For example, the metal nitride may be provided by atomic layer deposition or chemical vapour deposition.

The pellicle layer may be sufficiently strong to form a pellicle without a silicon support layer. As such, in use, the EUV radiation only needs to pass through the pellicle layer and does not need to pass through a silicon layer.

The sacrificial layer may be a layer which is able to be readily removed from the wafer without damaging the wafer. The sacrificial layer is preferably removed from the wafer before the wafer is used as a pellicle.

The wafer may further comprise a protective layer.

The protective layer preferably covers the at least one layer (namely the layer of material(s) deposited on one face of the wafer core). The protective layer acts as a barrier to prevent damage to the at least one layer and also serves as a support to the at least one layer when the wafer is etched away from underneath. Without the protective layer, the at least one layer could be damaged and/or the wafer may break along the scribeline if the at least one layer is not strong enough to support the weight of the silicon wafer.

The protective layer may comprise at least one of a polymer, a resist, and a lacquer. It will be appreciated that any suitable protective layer may be used.

Preferably, the protective layer comprises poly (p-xylene) (Parylene). It will be appreciated that any suitable polymer could be used. A polymer is suitable where it is non-reactive with respect to the at least one layer on the wafer and which is able to be removed from the wafer without causing damage. For example, the protective layer may be soluble in a solvent which does not dissolve the other materials forming the wafer, or may be reacted with a reactant that does not react with or reacts much more slowly with any of the other materials forming the wafer.

According to a second aspect of the present invention, there is provided a method of preparing a pellicle comprising the steps of: providing a wafer comprising a mask on one face and at least one layer on the opposite face, defining a scribeline in the mask, and selectively removing a portion of the at least one layer which at least partially overlies the scribeline.

Due to the limitations of known methods for producing pellicles, until now, there has been no suitable way of preparing a pellicle which did not result in the generation of particulate contaminants which could undesirably be deposited on the surface of the pellicle. The method according to the second aspect of the present invention allows for the production of a pellicle whilst minimizing the production of particulates. By selectively removing at least a portion of the at least one layer which at least partially overlies the scribeline, this allows the wafer to be etched away without the at least one layer bridging the scribeline. Consequently, there is no need to dice or cut the material bridging the scribeline and therefore the production of particles is reduced.

The mask may be a positive or negative resist and the scribeline may be defined in the resist using any suitable lithographic technique. As such, the scribeline may be formed in the mask using lithography.

At least a portion of the at least one layer may be removed by any suitable technique. Preferably, the technique used is etching, more preferably dry etching, although wet etching or a combination of dry and wet etching is also contemplated.

The method may further comprise providing a protective layer over at least a portion of the at least one layer.

As with the first aspect of the present invention, the protective layer may serve to support the wafer and stop it from breaking apart during etching. The protective layer may also protect the at least one layer on the wafer, which may be damaged by etching.

At least a portion of the protective layer may be removed in order to allow the excess wafer material to be removed from the pellicle. The protective layer may be removed from substantially the whole of the wafer, or may be removed substantially along the scribeline in order to allow the pellicle to be removed from the excess material whilst still retaining a layer of protection and support on the pellicle.

The at least one layer may comprise any of the materials described in respect of the first aspect of the present invention. As such, the pellicle may comprise a metal nitride layer. A metallic layer may be disposed on the metal nitride layer.

The protective layer may comprise any of the materials described in respect of the first aspect of the present invention.

According to a third aspect of the present invention, there is provided a method of preparing a pellicle comprising the steps of: providing a pellicle core, and removing at least some material from at least one face of the pellicle core in a non-oxidising environment.

It is desirable to provide a pellicle which offers high EUV transmissivity whilst retaining its ability to withstand the harsh conditions within a lithographic apparatus. Current EUV pellicles are extremely thin (less than around 100 nm) free standing membranes suspended in a frame. Existing pellicles comprise a silicon core with additional layers comprising silicon nitride, and molybdenum and/or ruthenium. Although the additional layers serve to increase the lifetime of the pellicle, they come at the cost of decreased EUV transmissivity and increased imaging impact mainly due to EUV reflection. Efforts are focused on making pellicles as robust as possible to ensure that no failures occur. However, it is expensive to make highly complex pellicles, and it is necessary to reduce the impact on imaging of the pellicle and increase EUV transmissivity in order to allow for high throughput through the lithography apparatus. Reference to a pellicle may also be considered to include reference to a wafer. As such, the pellicle produced according to the method according to the third aspect of the present invention may be the wafer in the first and second aspects of the present invention.

It has been found that the native oxide layer which occurs between the pellicle core and the capping layers is one cause of EUV transmission loss. Whilst efforts to reduce the thickness of this layer have been made, they have not been successful and it has not proven possible to eliminate the native oxide layer.

In the method according to the third aspect of the present invention, the native oxide layer is removed when the pellicle core is in a non-oxidising environment, such as a vacuum, in order to avoid the native oxide layer from re-growing. The non-oxidising environment may be substantially free of any oxygen. It may contain non-reactive gases, such as noble gases or nitrogen, or may comprise hydrogen. The gases are preferably at low pressure.

The method may comprise removal of at least a portion of the native oxide layer. The method may also alternatively or additionally comprise thinning the pellicle core material.

By removing the native oxide layer, the pellicle has greater EUV transmissivity and the surface onto which capping layers are subsequently deposited are more uniform, leading to a more uniform layering of the capping material(s). In addition, thinning the pellicle core has the same benefits, and additionally further reduces the overall thickness of the final pellicle.

The method may also comprise depositing a capping layer on at least one face of the pellicle.

The capping layer may be any of the materials described in respect of the first aspect of the present invention or any other suitable capping material. A metal nitride layer as described herein may be provided prior to the deposition of the capping layer. As described above, the presence of a metal nitride layer may provide a number of advantages for the ultimate pellicle.

The capping layer(s) provide improved performance of the pellicle. For example, they may increase the rate at which the pellicle emits heat, thereby reducing the operating temperature of the pellicle.

The material may be removed from the pellicle by any suitable means. Preferably, the material is removed by etching. The etching may be dry etching, wet etching, or a combination of the two. The dry etching may comprise sputtering of the silicon oxide layer. For example, a beam of ions of a noble gas may be directed onto the undesired silicon oxide layer in order to remove the layer from the surface. Sputtering can be continued to thin down the pellicle core. Alternatively or additionally, the etching can be carried out using etching gases, such as $C_xF_y$ gases or similar, as is known in the art.

In order to prevent oxidation or other contamination, the capping layer is deposited under vacuum. This reduces the risk of contaminants being caught between the pellicle core and the capping layer, which could weaken the final pellicle. As such, the etching step and the depositing step are preferably carried out without the pellicle leaving the non-oxidising environment. By keeping the pellicle within the non-oxidizing environment, this avoids an oxide layer re-growing on the surface of the pellicle core.

According to a fourth aspect of the present invention, there is provided a pellicle for a lithographic apparatus comprising a silicon core and one or more capping layers, wherein the pellicle is substantially devoid of an oxide layer between the silicon core and the one or more capping layers.

Having a pellicle which does not comprise a native oxide layer results in a pellicle which has improved transmissivity and improved uniformity of the capping layer(s). This provides for a more predictable and reproducible pellicle. The oxide layer removed is preferably silicon oxide.

The pellicle according to the fourth aspect of the present invention may comprise any of the materials described in respect of the first aspect of the present invention.

As such, the pellicle according to the fourth aspect of the present invention may comprise a metal nitride layer. The metal nitride layer may comprise ruthenium, molybdenum, boron, zirconium, titanium, tantalum, or combinations thereof. Preferably, the metal nitride layer comprises at least one of titanium nitride and tantalum nitride.

According to a fifth aspect of the present invention, there is provided a pellicle for a lithographic apparatus manufactured from or comprising a wafer according to the first or fourth aspects of the present invention, or according to the second or third or seventh aspects of the present invention.

According to a sixth aspect of the present invention, there is provided the use of a pellicle according to any of the first to fifth and seventh aspects of the present invention in a lithographic apparatus.

According to a seventh aspect of the present invention, there is provided a pellicle comprising at least one metal nitride layer.

As described above, the presence of a metal nitride layer provides a number of advantages over pellicles which do not comprise such a layer.

The at least one metal nitride layer may comprise ruthenium, molybdenum, boron, zirconium, titanium, tantalum, or combinations thereof. Preferably, the at least one metal nitride layer comprises titanium or tantalum nitride.

The at least one metal nitride layer may have any suitable thickness. The at least one metal nitride layer may be from about 0.1 nm to about 6 nm in thickness. Preferably, the at least one metal nitride layer is less than about 1.5 nm in thickness. In other pellicles, there may be provided a metallic layer of, for example, molybdenum underneath the capping layer. The metal nitride layer may replace the molybdenum layer partially or completely. Due to the advantageous properties provided by the metal nitride layer, the metal nitride layer may be thinner than layers disposed in an equivalent position in other pellicles. In addition, in cases where the metal nitride layer is oxidized during use, the oxide layer produced is much thinner than an oxide layer which is produced by the oxidation of an original layer which is thicker than the metal nitride layer. This reduces the change in transmissivity of the pellicle over time, which is desirable. For example, if a metallic layer, such as a molybdenum layer, is replaced by a metal nitride, for example titanium nitride, layer that is thinner than the molybdenum layer, the transmissivity of the resultant pellicle will increase, the observed change in EUV transmissivity during use will be lower and the pellicle will be able to withstand higher powers or temperatures.

The pellicle may comprise a metallic capping layer disposed on the at least one metal nitride layer. The metallic capping layer may comprise ruthenium, molybdenum, boron, zirconium, titanium, tantalum, or combinations thereof. Preferably, the metallic capping layer comprises ruthenium.

The metallic capping layer may be of any suitable thickness. The metallic capping layer may have a thickness of from about 0.1 nm to about 6 nm.

The pellicle may comprise one or more other layers as known in the art. The pellicle may comprise a frame which supports the pellicle membrane.

It will be appreciated that the first to seventh aspects of the present invention may be combined in any combination and that the features described in respect of one aspect may be combined with the features described in respect of another aspect of the invention. For example, a wafer produced according to the method of the third aspect of the present invention may be used in the method according to the second aspect of the present invention. Similarly, the wafer according to the first aspect of the present invention may comprise a wafer formed according to the third aspect of the present invention. That is to say that the wafer according to the first aspect of the present invention may be substantially devoid of a native oxide layer between the wafer and at least one layer, which may be a capping layer. In an example, any of the methods or apparatuses of any aspect of the present invention may comprise a step of providing a metal nitride layer or have a metal nitride layer, respectively. Furthermore, the advantages associated with features described in respect of one aspect of the present invention are also applicable to the other aspects of the present invention.

In summary, the methods of the present invention allow for the manufacture of a pellicle which has more predictable and reproducible performance compared with previous pellicles. The resulting pellicles are suitable for use in lithographic apparatus, such as, for example, and EUV lithography apparatus. It has not been previously possible to manufacture such a pellicle. The pellicles manufactured according to the methods of the present invention are able to resist the high temperatures achieved when the pellicle is in use and also resist attack by free radical species or other reactive species on account of the layer of coating material on either side of the pellicle. In addition, in embodiments wherein the method comprises providing a metal nitride layer or the pellicle comprises a metal nitride layer, the ultimate pellicle benefits from the advantages of having such a layer as described herein.

The present invention will now be described with reference to a silicon based pellicle. However, it will be appreciated that the present invention is not limited to silicon based pellicles and is equally applicable to spectral purity filters, as well as core materials other than silicon.

BRIEF DESCRIPTION OF THE DRAWINGS

Embodiments of the invention will now be described, by way of example only, with reference to the accompanying schematic drawings, in which.

DETAILED DESCRIPTION

Figure 1:
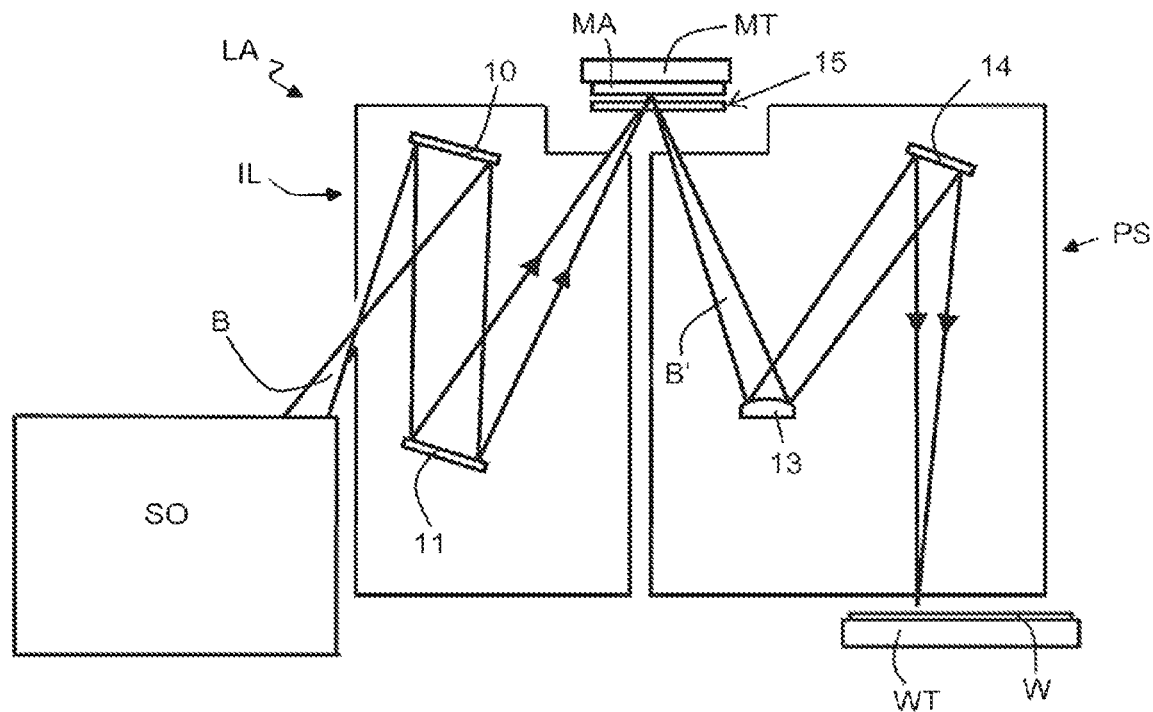
FIG. 1 depicts a lithographic system comprising a lithographic apparatus and a radiation source according to an embodiment of the invention.

FIG. 1 shows a lithographic system including a pellicle 15 according to the second, fourth, fifth and seventh aspects of the present invention or manufactured according to the methods of the first or third aspects of the present invention according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W. In this embodiment, the pellicle 15 is depicted in the path of the radiation and protecting the patterning device MA. It will be appreciated that the pellicle 15 may be located in any required position and may be used to protect any of the mirrors in the lithographic apparatus.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser which may for example be a $CO_2$ laser, is arranged to deposit energy via a laser beam into a fuel, such as tin (Sn) which is provided from a fuel emitter. Although tin is referred to in the following description, any suitable fuel may be used. The fuel may for example be in liquid form, and may for example be a metal or alloy. The fuel emitter may comprise a nozzle configured to direct tin, e.g. in the form of droplets, along a trajectory towards a plasma formation region. The laser beam is incident upon the tin at the plasma formation region. The deposition of laser energy into the tin creates a plasma at the plasma formation region. Radiation, including EUV radiation, is emitted from the plasma during de-excitation and recombination of ions of the plasma.

The EUV radiation is collected and focused by a near normal incidence radiation collector (sometimes referred to more generally as a normal incidence radiation collector). The collector may have a multilayer structure which is arranged to reflect EUV radiation (e.g. EUV radiation having a desired wavelength such as 13.5 nm). The collector may have an elliptical configuration, having two ellipse focal points. A first focal point may be at the plasma formation region, and a second focal point may be at an intermediate focus, as discussed below.

The laser may be separated from the radiation source SO. Where this is the case, the laser beam may be passed from the laser to the radiation source SO with the aid of a beam delivery system (not shown) comprising, for example, suitable directing mirrors and/or a beam expander, and/or other optics. The laser and the radiation source SO may together be considered to be a radiation system.

Radiation that is reflected by the collector forms a radiation beam B. The radiation beam B is focused at a point to form an image of the plasma formation region, which acts as a virtual radiation source for the illumination system IL. The point at which the radiation beam B is focused may be referred to as the intermediate focus. The radiation source SO is arranged such that the intermediate focus is located at or near to an opening in an enclosing structure of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figures 2A, 2B:
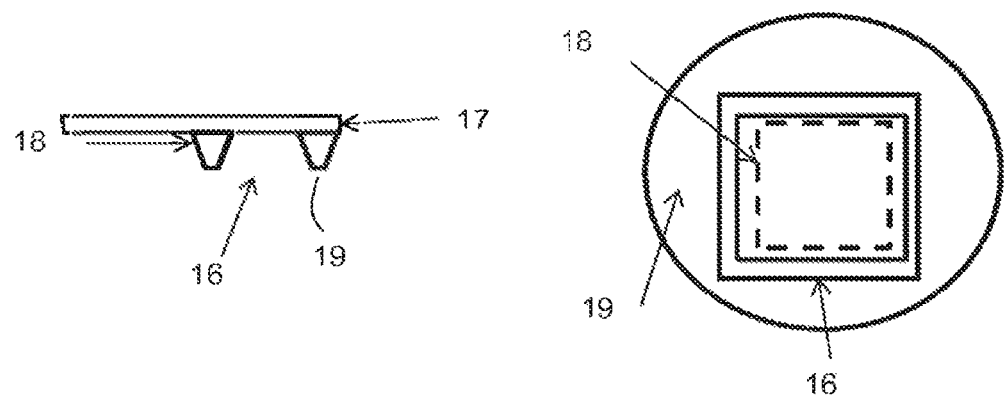
FIG. 2 depicts a schematic view of a prior art pellicle.

FIG. 2a shows a schematic depiction of a cross-section of pellicle produced according to the prior art methods. In this figure, the silicon support has already been etched away to leave a border 18 and wafer remains 19 separated by a scribeline 16. The scribeline 16 is bridged by the capping layer 17. As such, in order to release the border 18 from the wafer remains 19, it is necessary to break or cut the capping layer 17 bridging the scribeline 16, which can result in the production of unwanted particles which may contaminate the capping layer 17.

FIG. 2b shows a schematic plan view of the pellicle shown in FIG. 2a. The border 18 is shown in phantom lines inboard of the scribeline 16. It will be appreciated that the scribeline 16 would not be visible due to the presence of the capping layer 17, but the scribeline 16 is shown for reasons of clarity. The border 18 of the silicon wafer acts as a frame around the capping material 17 in order to support the capping material 17 when in use as a pellicle.

Figure 3A:
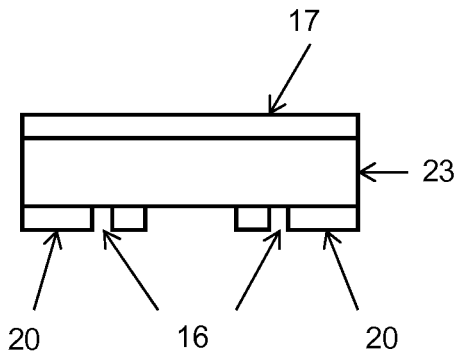
FIGS. 3a to 3d depict a pellicle and a method according to the first and second aspects of the present invention.

FIG. 3a depicts a wafer according to the present invention comprising a wafer 23, a capping layer (the at least one layer) 17, scribeline 16, and mask 20. The capping layer 17 is continuous across the surface of the wafer 23 and the mask 20 on the opposite side of the wafer 23 defines scribeline 16. The capping layer 17 may comprise a metal nitride layer (not shown). The capping layer 17 may comprise a metallic layer and a metal nitride layer disposed between the metallic layer and the wafer 23. As described above, the presence of a metal nitride layer has been surprisingly found to have a number of benefits.

Figure 3B:
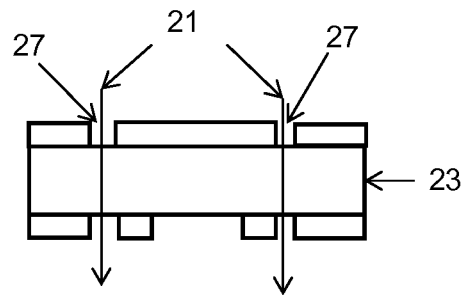

FIG. 3b depicts the wafer after a portion 27 of the capping layer 17 overlying the scribeline 16 has been removed. Arrows 21 indicate how at least a portion of the gap 27 in the capping layer 17 overlie at least a portion of the scribeline 16.

Figure 3C:
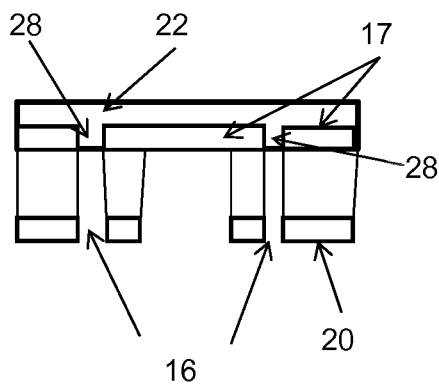

In FIG. 3c, a protective layer 22 has been applied to the wafer and the wafer 23 has been etched away in the places not protected by mask 20. The etching process does not remove the protective layer 22. Crucially, there is no capping material 17 bridging the scribeline 16.

As shown in FIG. 3c, the protective layer 22 may have a projecting part 28, which extends into the gap 27.

Figure 3D:
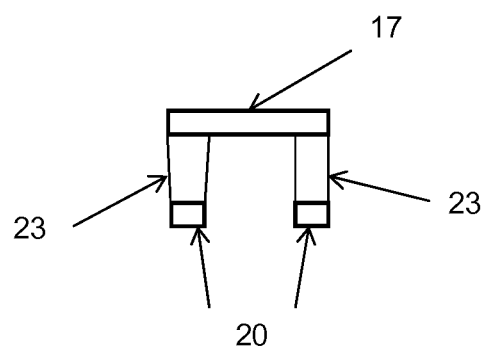

In FIG. 3d, the protective layer 22 has been removed and the excess material has been removed in order to arrive at a pellicle. The remaining material from the wafer 23 serves as a frame to support the capping material 17 when in use as a pellicle. It will be appreciated that the figures are not to scale and are merely used to illustrate the different layers in the pellicle rather than their respective dimensions.

Figure 4:
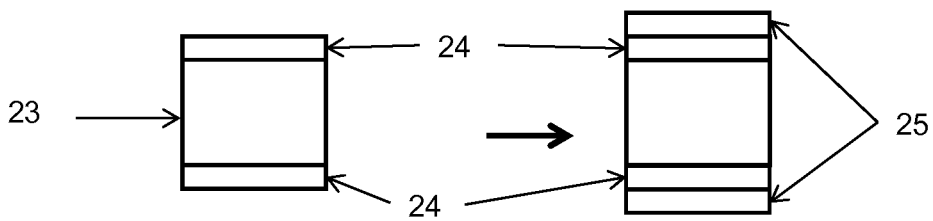
FIG. 4 depicts a prior art method of capping a pellicle core.

FIG. 4 depicts a schematic view of a pellicle according to the prior art. The core material comprises a wafer 23 core that is capped by native oxide layers 24. When the capping layer 25 is deposited onto the wafer, the native oxide layer 24 is between the core 23 and the capping layer 25.

Figure 5A:
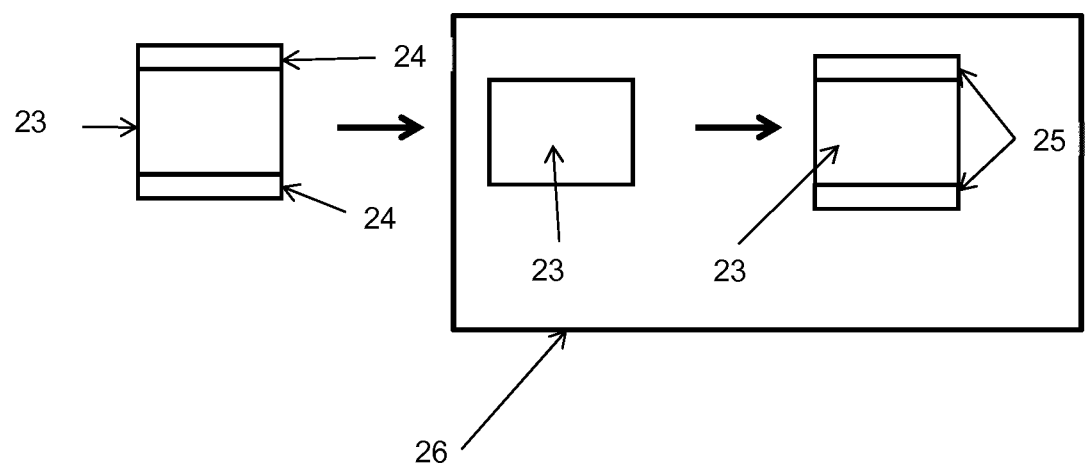
FIGS. 5a and 5b depict a pellicle and a method according to the third and fourth aspects of the present invention.

FIG. 5a depicts the same wafer as shown in FIG. 4, but the native oxide layer is removed from the wafer 23 inside a non-oxidising atmosphere or a vacuum 26. The capping layer is deposited onto the core whilst still in the non-oxidising atmosphere or vacuum 26, which results in a pellicle which does not comprise a native oxide layer. A metal nitride layer (not shown) may be provided on the core layer once the native oxide layer has been removed. A metallic capping layer may subsequently be provided on the metal nitride layer. The metal nitride layer and the metallic layer may comprise any of the metals described in respect of any aspect of the present invention.

Figure 5B:
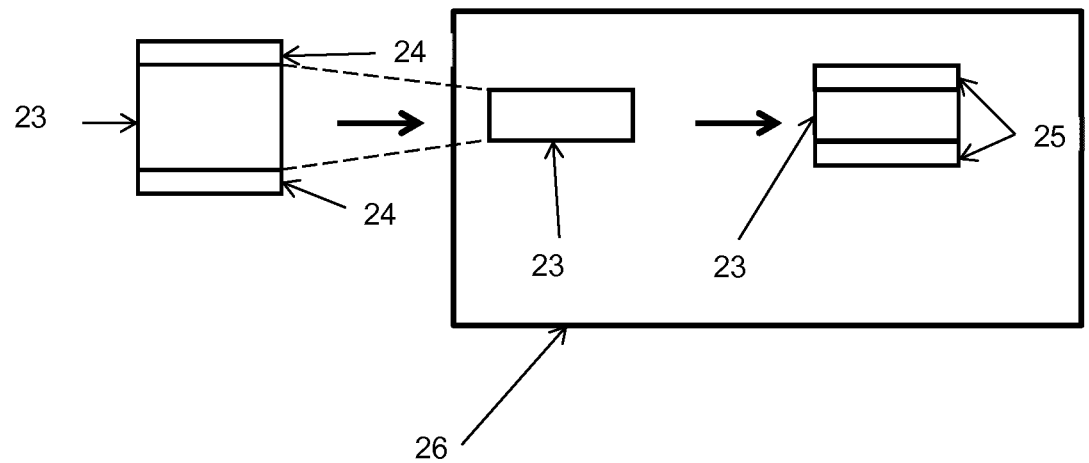

FIG. 5b is similar to FIG. 5a, but depicts the case where the native oxide layers 24 are removed and the wafer 23 is thinned down, thereby resulting in a pellicle which is thinner and has better transmissivity than existing pellicles. The capping layer 25 is deposited after the native oxide layer has been removed and/or when the pellicle core has been thinned down. Again, a metal nitride layer may be provided once the native oxide layer has been removed and/or the pellicle core has been thinned down. In this way, there may be a metal nitride layer provided between the wafer 23 and the capping layer 25. The removal of the native oxide layer and a portion of the pellicle core and the subsequent deposition of the capping layer is carried out within a non-oxidizing environment.

Embodiments of the invention may also be described as worded in the following clauses:

1) A wafer comprising a mask on one face and at least one layer on the opposite face, wherein the mask comprises at least one scribeline which overlies at least a portion of the opposite face which is substantially free of the at least one layer.
2) A wafer according to clause 1, wherein the wafer comprises silicon.
3) A wafer according to clause 1 or 2, wherein the mask comprises a positive or a negative resist.
4) A wafer according to any of clauses 1 to 3, wherein the at least one layer comprises one or more of a membrane, a sacrificial layer, and a pellicle layer.
5) A wafer according to clause 4, wherein the pellicle layer comprises at least one of a metallic layer, an oxide layer, a nitride layer, a silicide layer, a semi-metallic layer, a non-metallic layer, and a metal nitride layer, optionally wherein the metallic layer and/or the metal nitride layer comprises ruthenium, molybdenum, boron, zirconium, titanium, tantalum, or combinations thereof.
6) A wafer according to any of clauses 1 to 5, wherein the wafer further comprises a protective layer.
7) A wafer according to clause 6, wherein the protective layer is arranged over the at least one layer, the at least one layer being arranged between the protective layer and the mask.
8) A wafer according to clause 7, wherein the protective layer has a projecting part extending into a gap formed in the at least one layer at the location where said portion of the opposite face is substantially free of the at least one layer.
9) A wafer according to any of clauses 6-8, wherein the protective layer comprises at least one of a polymer, a resist, and a lacquer, preferably wherein the polymer is poly (p-xylylene).
10) An assembly, comprising a wafer, a mask provided on one face of the wafer, and at least one layer provided on the opposite face of the wafer, wherein the mask comprises at least one scribeline which overlies at least a portion of the opposite face which is substantially free of the at least one layer.
11) An assembly according to clause 10, wherein the wafer comprises silicon.
12) An assembly according to clause 10 or 11, wherein the mask comprises a positive or a negative resist.
13) An assembly according to any of clauses 10 to 12, wherein the at least one layer comprises one or more of a membrane, a sacrificial layer, and a pellicle layer.
14) An assembly according to clause 13, wherein the pellicle layer comprises at least one of a metallic layer, an oxide layer, a nitride layer, a silicide layer, a semi-metallic layer, a non-metallic layer, and a metal nitride layer, optionally wherein the metallic layer and/or the metal nitride layer comprises ruthenium, molybdenum, boron, zirconium, titanium, tantalum, or combinations thereof.
15) An assembly according to any of clauses 10 to 14, wherein the assembly further comprises a protective layer.
16) An assembly according to clause 15, wherein the at least one layer is arranged between the protective layer and the wafer.
17) An assembly according to clause 16, wherein the protective layer has a projecting part extending into a gap formed in the at least one layer at the said portion of the opposite face which is substantially free of the at least one layer.
18) An assembly according to any of clauses 10-18, wherein the protective layer comprises at least one of a polymer, a resist, and a lacquer, preferably wherein the polymer is poly (p-xylylene).
19) A method of preparing a pellicle comprising the steps of: providing a wafer comprising a mask on one face and at least one layer on the opposite face, defining a scribeline in the mask, and selectively removing a portion of the at least one layer which at least partially overlies the scribeline.
20) The method according to clause 19, wherein the method further comprises providing a protective layer over at least a portion of the at least one layer.
21) The method according to clause 19, wherein the method further comprises providing a protective layer over at least a portion of the at least one layer such that said at least a portion of the at least one layer is arranged between the protective layer and the mask.
22) The method according to clause 20 or 21, wherein the protective layer is provided with a projecting part extending into a gap formed by said selectively removed portion of the at least one layer.
23) The method according to any of clauses 19 to 22, the method further comprising etching at least a portion of the wafer.
24) The method according to clause 23, the method further comprising removing at least a portion of the protective layer.
25) The method according to any of clauses 19 to 24, wherein the scribeline and/or the mask is defined by lithography.

26) The method according to any of clauses 19 to 25, wherein the at least one layer comprises one or more of a membrane, a sacrificial layer, and a pellicle layer.
27) The method according to any of clauses 23 to 26, wherein the etching is dry etching, wet etching, or a combination of the two.
28) The method according to any of clauses 19 to 27, wherein the protective layer comprises at least one of a polymer, a resist, and a lacquer.
29) The method according to clause 28, wherein the protective layer comprises poly (p-xylylene).
30) A method of preparing a pellicle comprising the steps of: providing a pellicle core, and removing at least some material from at least one face of the pellicle core in a non-oxidising environment.
31) A method according to clause 30, wherein the method further comprises depositing a capping layer on at least one face of the pellicle, optionally wherein the capping layer comprises a metal nitride layer and/or a metallic layer.
32) A method according to clause 30 or 31, wherein the material is removed by etching.
33) A method according to clause 32, wherein the etching is dry etching, wet etching, or a combination of the two.
34) A method according to clause 32 or 33, wherein the etching is effected by directing a beam of ions of a noble gas onto the surface of the pellicle core.
35) A method according to any of clauses 31 to 34, wherein the capping layer is deposited under vacuum.
36) A method according to any of clauses 30 to 35, wherein the non-oxidising environment is a vacuum.
37) A pellicle for a lithographic apparatus comprising a silicon core and one or more capping layers, wherein the pellicle is substantially devoid of an oxide layer between the silicon core and the one or more capping layers.
38) A pellicle for a lithographic apparatus manufactured from or comprising a wafer according to any of clauses 1 to 9 or an assembly according to any of clauses 10-18 or clause 37, or according to the methods of clauses 19 to 36.
39) Use of a pellicle manufactured according to the methods of clauses 19 to 36 or according to any of clauses 1 to 18 or 37 in a lithographic apparatus.
40) A pellicle for a lithographic apparatus, wherein said pellicle comprises at least one metal nitride layer.
41) A pellicle according to clause 40, wherein the at least one metal nitride layer comprises at least one of titanium nitride and tantalum nitride.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An assembly, comprising a wafer, a mask provided on one face of the wafer, and at least one layer provided on an opposite face of the wafer to the one face, wherein the mask comprises at least one scribeline which overlies at least a portion of the opposite face which is substantially free of the at least one layer such that, when the assembly is split at at least one scribeline and the portion of the opposite face, there is substantially no cantilever of the at least one layer over an adjacent empty space at the split.

2. The assembly according to claim 1, wherein the wafer comprises silicon, and/or the mask comprises a positive or negative resist and/or the at least one layer comprises one or more selected from: a membrane, a sacrificial layer, and/or a pellicle layer.

3. The assembly according to claim 1, wherein the wafer further comprises a protective layer, and wherein the at least one layer is arranged between the protective layer and the wafer.

4. The assembly according to claim 3, wherein the protective layer has a projecting part extending into a gap formed in the at least one layer at the portion of the opposite face which is substantially free of the at least one layer.

5. The assembly according to claim 3, wherein the protective layer comprises at least one selected from: a polymer, a resist, and/or a lacquer.

6. A method of preparing a pellicle, the method comprising:
providing an assembly comprising a wafer, a mask provided on one face of the wafer, and at least one layer provided on an opposite face of the wafer to the one face,
defining a scribeline in the mask, and
selectively removing a portion of the at least one layer which at least partially overlies the scribeline such that, when the assembly is split at at least one scribeline and the portion of the opposite face, there is substantially no cantilever of the at least one layer over an adjacent empty space at the split.

7. The method according to claim 6, further comprising providing a protective layer over at least a portion of the at least one layer such that the at least a portion of the at least one layer is arranged between the protective layer and the mask.

8. The method according to claim 7, wherein the protective layer is provided with a projecting part extending into a gap formed by the selectively removed portion of the at least one layer.

9. The method according to claim 6, further comprising etching at least a portion of the wafer and/or removing at least a portion of a protective layer.

10. The method according to claim 6, wherein the scribeline and/or the mask is defined by lithography, and/or wherein the at least one layer comprises one or more selected from: a membrane, a sacrificial layer, and/or a pellicle layer, and/or wherein the wafer has a protective layer comprising at least one selected from: a polymer, a resist, and/or a lacquer.

11. A method of preparing a pellicle, the method comprising:
providing a pellicle core, and
removing at least some material from at least one face of the pellicle core in a non-oxidising environment.

12. The method according to claim 11, further comprising depositing a capping layer on at least one face of the pellicle.

13. The method according to claim 12, wherein the capping layer is deposited under vacuum and/or wherein the non-oxidising environment is a vacuum.

14. A pellicle for a lithographic apparatus, the pellicle comprising a silicon core and one or more capping layers, wherein the pellicle is substantially devoid of an oxide layer between the silicon core and the one or more capping layers.

15. A pellicle for a lithographic apparatus manufactured from or comprising the assembly according to claim 1.

16. A pellicle for a lithographic apparatus, the pellicle comprising at least one metal nitride layer and a metallic capping layer disposed on the at least one metal nitride layer.

17. The pellicle according to claim 16, wherein the at least one metal nitride layer comprises ruthenium, molybdenum, boron, zirconium, titanium, tantalum, or a combination selected therefrom.

18. The pellicle according to claim 16, wherein the metallic capping layer comprises ruthenium, molybdenum, boron, zirconium, titanium, tantalum, or a combination selected therefrom.

19. The pellicle according to claim 16, further comprising a pellicle frame of silicon, wherein the metal nitride layer is arranged between the frame and the metallic capping layer, and wherein the metal nitride layer is provided on the frame substantially devoid of an oxide layer between the frame and the metal nitride layer.

20. The pellicle according to claim 16, wherein the metallic capping layer comprises ruthenium, and wherein the metal nitride layer comprises, or is made of, titanium nitride and/or tantalum nitride.

\* \* \* \* \*